(12) United States Patent
Jung

(10) Patent No.: US 8,647,521 B2
(45) Date of Patent: *Feb. 11, 2014

(54) METHOD OF FORMING MICRO PATTERN OF SEMICONDUCTOR DEVICE

(75) Inventor: Woo Yung Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 1394 days.

This patent is subject to a terminal disclaimer.

(21) Appl. No.: 12/133,372

(22) Filed: Jun. 5, 2008

(65) Prior Publication Data

US 2009/0170326 A1 Jul. 2, 2009

(30) Foreign Application Priority Data

Dec. 27, 2007 (KR) .......................... 10-2007-138493

(51) Int. Cl.
*B44C 1/22* (2006.01)
*H01L 21/311* (2006.01)

(52) U.S. Cl.
USPC .................... 216/41; 216/13; 216/58; 216/67; 438/689; 438/694; 438/706; 438/710; 430/313

(58) Field of Classification Search
USPC ............................ 216/13, 41, 58, 67; 430/313
See application file for complete search history.

(56) References Cited

U.S. PATENT DOCUMENTS

| | | | |
|---|---|---|---|
| 2005/0151256 A1* | 7/2005 | Natzle | 257/750 |
| 2006/0216938 A1 | 9/2006 | Miyagawa et al. | |
| 2007/0072366 A1* | 3/2007 | Kang et al. | 438/243 |
| 2007/0099431 A1* | 5/2007 | Li | 438/735 |
| 2007/0148968 A1* | 6/2007 | Kwon et al. | 438/671 |
| 2007/0202697 A1* | 8/2007 | Jung | 438/669 |
| 2007/0287101 A1* | 12/2007 | Kim et al. | 430/313 |
| 2009/0170330 A1* | 7/2009 | Jung | 438/703 |

FOREIGN PATENT DOCUMENTS

| | | |
|---|---|---|
| JP | 2006-261307 | 9/2006 |
| KR | 100574999 B1 | 4/2006 |
| KR | 100595328 B1 | 6/2006 |
| KR | 100714305 B1 | 4/2007 |
| KR | 100757414 B1 | 9/2007 |
| KR | 100790998 B1 | 12/2007 |

* cited by examiner

*Primary Examiner* — Shamim Ahmed
(74) *Attorney, Agent, or Firm* — Kilpatrick Townsend & Stockton LLP

(57) ABSTRACT

The present invention relates to a method of forming micro patterns of a semiconductor device. In the method according to an aspect of the present invention, first etch mask patterns having a second pitch, which is twice larger than a first pitch of target patterns, are formed in a column direction over a semiconductor substrate. An auxiliary film is formed over the semiconductor substrate including a surface of the first etch mask patterns. An etch mask film is formed over the semiconductor substrate including the auxiliary film. An etch process is performed in order to form second etch mask patterns having the second pitch in such a manner that the etch mask film, the auxiliary film, and the first etch mask patterns are isolated from one another in a row direction and the etch mask film remains between the first etch mask patterns. The auxiliary film between the first and second etch mask patterns is removed.

54 Claims, 6 Drawing Sheets

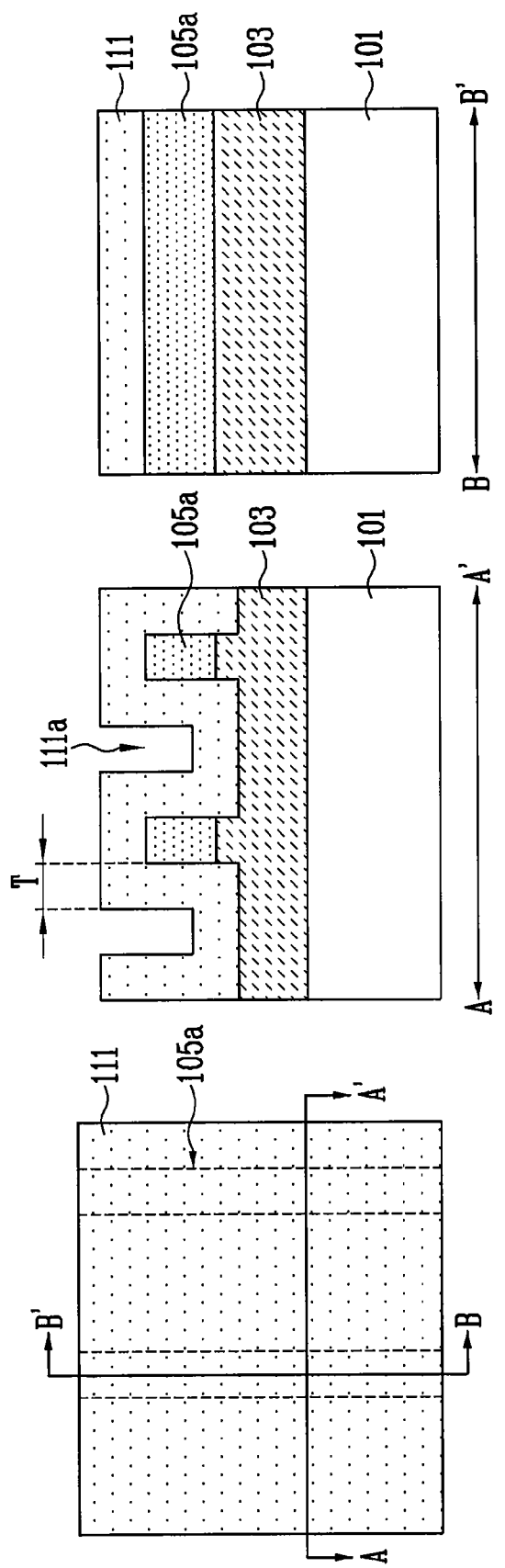

METHOD OF FORMING MICRO PATTERN OF SEMICONDUCTOR DEVICE

CROSS-REFERENCES TO RELATED APPLICATIONS

The present application claims priority to Korean patent application number 10-2007-138493, filed on Dec. 27, 2007, which is incorporated by reference in its entirety.

BACKGROUND OF THE INVENTION

The present invention relates to a method of forming micro patterns of a semiconductor device and, more particularly, to a method of forming micro patterns in which target patterns arranged in matrix form are created with features (e.g., pitch) smaller than the resolution of an exposure apparatus.

A plurality of semiconductor elements, such as a transistor and metal lines for electrically connecting the semiconductor elements, are formed in a semiconductor substrate. The metal lines and a junction region (e.g., the source or drain of the transistor) of the semiconductor substrate are electrically connected by a contact plug.

In the case of DRAM devices, a transistor and a storage node contact plug are formed in a semiconductor substrate. To this end, an interlayer dielectric layer and contact holes are first formed. DRAM is classified into various types according to the arrangement of the memory cell arrays. In 6F2 DRAM devices, active regions are arranged in matrix form in a cell region. In particular, the active regions are formed in a rectangular form with regular spacing. As the degree of integration increases, the size or spacing of the active regions in the 6F2 DRAM device can have a pitch smaller than the resolution limit of an exposure apparatus. Due to this, when forming a photoresist pattern for defining the active regions, an exposure process on a photoresist film may have to be performed more than once. Consequently, the process cost increases and it is also difficult to reduce k1 (i.e., the scale of the resolution) to 0.20 or less.

BRIEF SUMMARY OF THE INVENTION

The present invention relates to a method of forming micro patterns of a semiconductor device, in which hard mask patterns (e.g., active regions of DRAM) of a matrix form, which are arranged more densely than the resolution of an exposure apparatus.

A method of forming micro patterns of a semiconductor device according to a first embodiment of the present invention includes forming first etch mask patterns having a second pitch, which is twice larger than a first pitch of target patterns, in a column direction over a semiconductor substrate, forming an auxiliary film over the semiconductor substrate including a surface of the first etch mask patterns, forming an etch mask film over the semiconductor substrate including the auxiliary film, performing an etch process in order to form second etch mask patterns having the second pitch in such a manner that the etch mask film, the auxiliary film, and the first etch mask patterns are isolated from one another in a row direction and the etch mask film remains between the first etch mask patterns, and removing the auxiliary film between the first and second etch mask patterns.

A method of forming micro patterns of a semiconductor device according to a second embodiment of the present invention includes forming first etch mask patterns over a semiconductor substrate, forming an auxiliary film over the semiconductor substrate including a surface of the first etch mask patterns, forming an etch mask film over the semiconductor substrate including the auxiliary film, performing an etch process in order to form second etch mask patterns in such a manner that the etch mask film, the auxiliary film, and the first etch mask patterns are isolated from one another in a direction to cross the first etch mask patterns and the etch mask film remains in spaces between the auxiliary films formed on sidewalls of the first etch mask patterns, and removing the auxiliary film between the first and second etch mask patterns.

A method of forming micro patterns of a semiconductor device according to a third embodiment of the present invention includes forming first etch mask patterns in a column direction over a semiconductor substrate, forming an auxiliary film over the semiconductor substrate including a surface of the first etch mask patterns, forming an etch mask film over the semiconductor substrate including the auxiliary film, performing an etch process in order to form second etch mask patterns in such a manner that the etch mask film, the auxiliary film, and the first etch mask patterns are isolated from one another in a row direction and the etch mask film remains in spaces between the auxiliary films formed on sidewalls of the isolated first etch mask patterns, and removing the auxiliary film between the first and second etch mask patterns.

A method of forming micro patterns of a semiconductor device according to a fourth embodiment of the present invention includes forming a hard mask film and a first etch mask film over a semiconductor substrate, forming first etch mask patterns in a column direction by patterning the first etch mask film, forming an auxiliary film over the hard mask film including a surface of the first etch mask patterns, forming a second etch mask film over the semiconductor substrate including the auxiliary film, performing an etch process in order to form second etch mask patterns in such a manner that the second etch mask film, the auxiliary film and the first etch mask patterns are isolated from one another in a row direction and the second etch mask film remains in spaces between the auxiliary film formed on sidewalls of the first etch mask patterns, removing the auxiliary film between the first and second etch mask patterns, and forming hard mask patterns by etching the hard mask film using an etch process employing the first and second etch mask patterns.

In the above embodiments, a pitch of the first etch mask patterns and a pitch of the second etch mask patterns is twice larger than a pitch of target patterns. A distance between the first and second etch mask patterns is decided by a thickness of the auxiliary film formed on sidewalls of the first etch mask patterns. A thickness of the auxiliary film formed on sidewalls of the first etch mask patterns corresponds to a horizontal distance of an active region. A width of each of the first and second etch mask patterns corresponds to a width in a shorter direction of an active region. A distance where the first etch mask patterns are isolated from each other corresponds to a vertical distance of an active region. A length of the first etch mask pattern isolated by the etch process corresponds to a length in a longer direction of an active region. A length of the first etch mask pattern isolated by the etch process is twice larger than a width of the first etch mask pattern.

In the above embodiments, the formation of the first etch mask patterns includes forming a photoresist pattern over the first etch mask film, forming the first etch mask patterns by etching the first etch mask film using an etch process employing the photoresist pattern, and further etching the hard mask film so that the photoresist pattern is removed.

In the above embodiments, the performance of the etch process includes etching the etch mask film and the auxiliary film so that the etch mask film and the auxiliary film are isolated from each other in a direction to cross the first etch mask patterns, and forming the second etch mask patterns by etching the first etch mask patterns exposed between the auxiliary films and etching the etch mask film so that the isolated etch mask film remains between the auxiliary films formed on the sidewalls of the first etch mask patterns.

In the above embodiments, the performance of the etch process includes etching the second etch mask film and the auxiliary film so that the second etch mask film and the auxiliary film are isolated from each other in a direction to cross the first etch mask patterns, and forming the second etch mask patterns by etching the first etch mask patterns exposed between the auxiliary films and etching the second etch mask film so that the isolated second etch mask film remains between the auxiliary films formed on the sidewalls of the first etch mask patterns.

In the above embodiments, the first and second etch mask patterns may be formed using the same material, preferably, a Si-containing BARC (Bottom Anti-Reflective Coating) film. The second etch mask patterns may be formed of a Si-containing BARC layer. The auxiliary film may be formed of a carbon polymer film. The auxiliary film may be removed using an etch process employing $O_2$ plasma. The hard mask film may be formed of a carbon film.

BRIEF DESCRIPTION OF THE DRAWINGS

FIGS. 1A to 1F are sectional views illustrating a method of forming micro patterns of a semiconductor device according to an embodiment of the present invention.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

FIGS. 1A to 1F are sectional views illustrating a method of forming micro patterns of a semiconductor device according to an embodiment of the present invention.

Figure 1A:
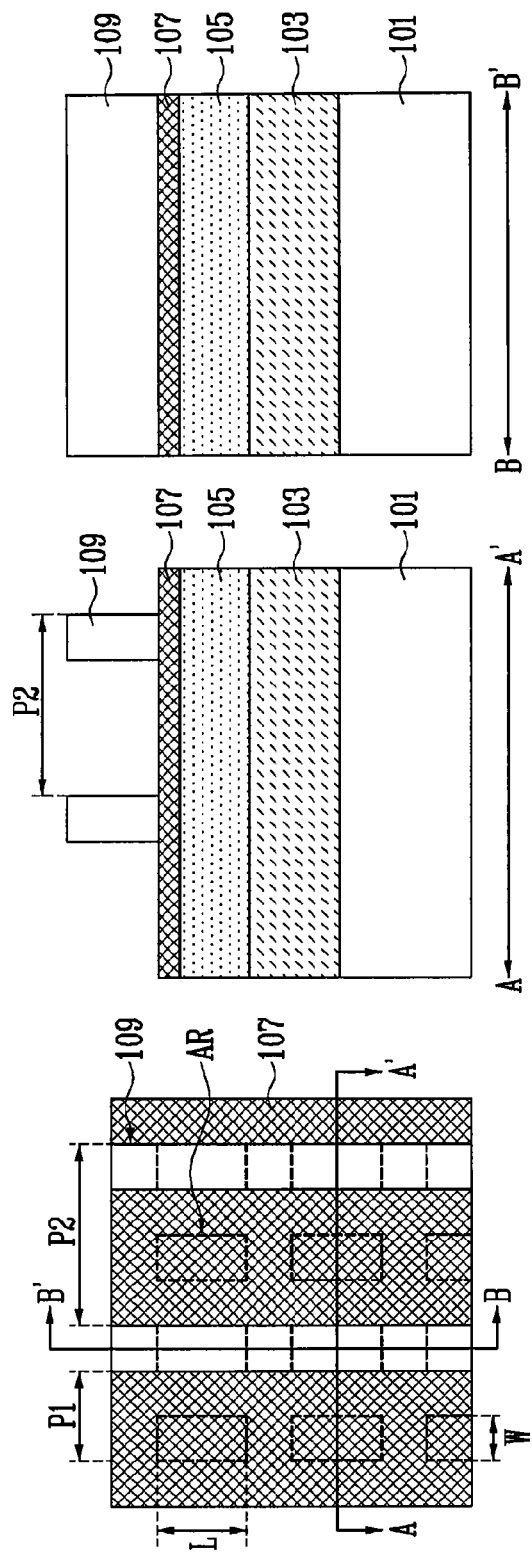

Referring to FIG. 1A, a hard mask film 103, a first etch mask film 105, a first ARC (Anti-Reflective Coating) film 107 and a first photoresist pattern 109 are formed over a semiconductor substrate 101. Before the hard mask film 103 is formed, a buffer film such as an oxide film may be formed. Here, the hard mask film 103 may be formed of a carbon film. The carbon film can be formed using a spin-coating method. The first etch mask film 105 may be formed of a Si-containing BARC (Bottom ARC) film. The first ARC layer 107 functions to prohibit diffused reflection in an exposure process for forming the first photoresist pattern 109. If the first etch mask film 105 can perform the anti-reflection function, the first ARC layer 107 may be omitted.

A case where rectangular target patterns arranged in a matrix is formed using a hard mask pattern for defining the target patterns is described below as an example. The hard mask patterns of a matrix form can be used to define active regions AR in a 6F2 DRAM manufacturing process. In this case, the hard mask pattern can be used as an isolation mask in an etch process for etching the semiconductor substrate of an isolation region.

The active regions AR are shaped in a rectangular form and arranged in matrix form. A length L in a longer direction of the active region AR can be double a width W in a shorter direction of the active region AR. The lines of the first photoresist patterns 109 are formed in parallel in one direction. Specifically, for example, in the case of 6F2 DRAM devices, the first photoresist patterns 109 are formed parallel to the longer direction of the active regions AR and on the active regions AR located in odd-numbered (or even-numbered) columns. Hence, a pitch P2 of the first photoresist patterns 109 is double a pitch P1 in a row direction of the active regions AR. Further, the width of the first photoresist pattern 109 decides the width of the active region AR.

Figure 1B:
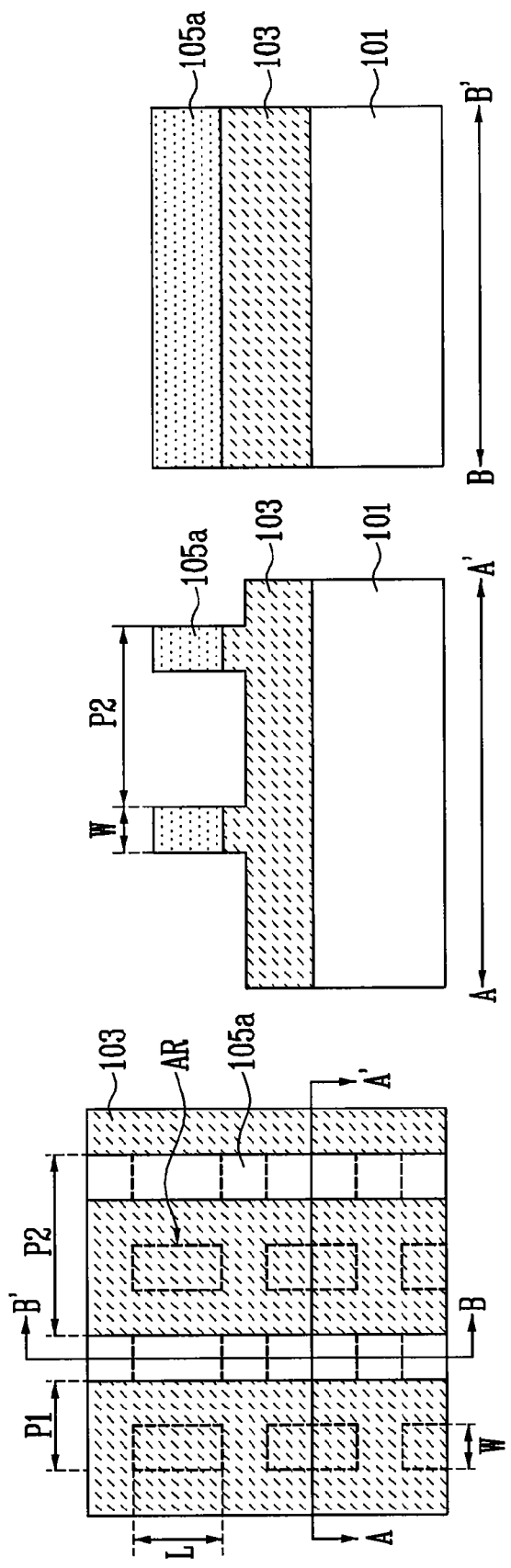

Referring to FIG. 1B, first etch mask patterns 105a are formed by patterning the first ARC layer 107 and the first etch mask film 105 using an etch process employing the first photoresist patterns 109 as an etch mask. The first etch mask patterns 105a are patterned according to the shape of the first photoresist patterns 109.

Meanwhile, after the first etch mask patterns 105a are formed, a subsequent process can be performed without removing the first photoresist patterns 109 and the first ARC layer 107. However, in this case, the pattern can collapse by the deformation of the first photoresist patterns 109 and the first ARC layer 107 due to a subsequent thermal treatment process. Thus, the first photoresist patterns 109 and the first ARC layer 107 are removed in one implementation. To remove the first photoresist patterns 109 and the first ARC layer 107, an additional etch process can be performed. Further, if the first etch mask patterns 105a are formed by etching the first etch mask film 105 and the exposed portion of the hard mask film 103 is etched to a certain depth, the first photoresist patterns 109 and the first ARC layer 107 can be removed together even though there is a difference in the etch selectivity. In the latter case, a hard baking process, which is performed before a subsequent process (e.g., the formation process of a second etch mask film) and performed after the first etch mask patterns 105a are formed, can be omitted. Alternatively, the etch process for forming the first etch mask patterns 105a and the formation process of the second etch mask film can be performed in-situ while they are maintained in a vacuum state within the same chamber. Meanwhile, since little remains (if any) of the first photoresist patterns 109 or the first ARC layer 107, the collapse of the pattern due to a subsequent thermal treatment process can be prevented. Trenches are formed in the hard mask film 103 by etching a part of the exposed hard mask film 103.

Referring to FIG. 1C, an auxiliary film 111 is formed on the hard mask film 103 including the surface of the exposed first etch mask patterns 105a. The auxiliary film 111 may be formed of carbon polymer.

The auxiliary film 111 is formed to a thickness in which the step generated by the first etch mask patterns 105a can be maintained. That is, the auxiliary film 111 is formed conformal to the pattern defined by the first etch mask patterns 105a. The thickness T of the auxiliary film 111 formed on the sidewalls of the first etch mask patterns 105a controls a distance in one direction of the active regions in a subsequent process. Thus the thickness of the auxiliary film 111 may be controlled according to the desired distance in one direction of the active regions. As the auxiliary film 111 is formed conformal to the first etch mask patterns 105, a plurality of concave (凹) portions 111a (or trenches) are defined between the first etch mask patterns 105a. The concave portions 111a correspond to the width of the active regions AR. That is, the width of the trench of the auxiliary film 111 defines the width of the active region.

Figure 1D:
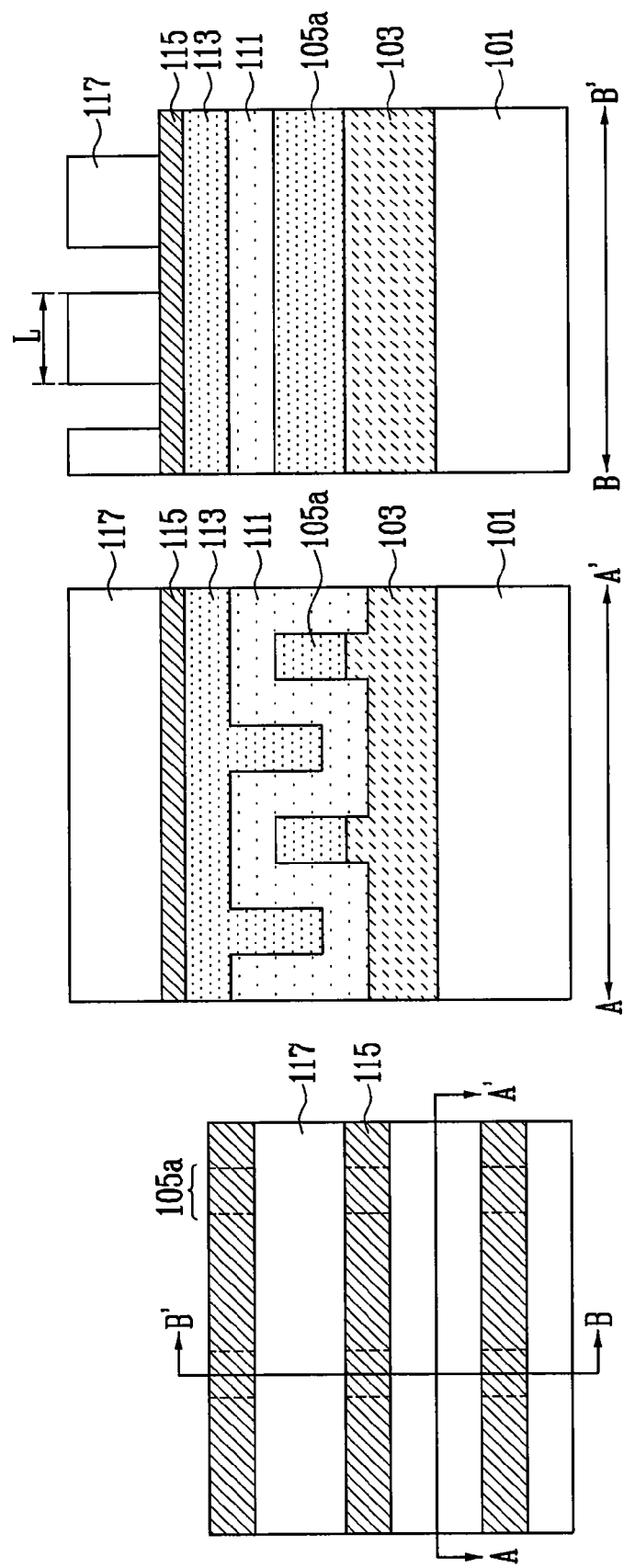

Referring to FIG. 1D, a second etch mask film 113 is formed over the semiconductor substrate 101 including the auxiliary film 111 such that the spaces (i.e., the recesses or concave portions) between the auxiliary films 111 formed on the sidewalls of the first etch mask patterns 105a are gap filled. A second ARC layer 115 is formed on the second etch mask film 113. Second photoresist patterns 117 are formed on the second ARC layer 115.

The second etch mask film 113 may be formed using the same material as that of the first etch mask patterns 105a in order to facilitate a subsequent process. That is, the second etch mask film 113 may be formed of a Si-containing BARC film. As described above with reference to FIG. 1A, if the second etch mask film 113 can perform the anti-reflection function in the exposure process of forming the second photoresist patterns 117, the second ARC layer 115 may be omitted.

The second photoresist patterns 117 are formed in a direction perpendicular to the first photoresist patterns (refer to 109 of FIG. 1A). The width of the second photoresist pattern 117 is double the width of the first photoresist pattern 109. For example, in the case of a 6F2 DRAM device, the second photoresist patterns 117 are formed in a direction crossing the first photoresist patterns (refer to 109 of FIG. 1A) and on the active regions AR (i.e., in a column direction). A pitch in a row direction of the second photoresist patterns 117 is substantially identical to that between the row directions of the active regions AR. Further, a width L of the second photoresist pattern 117 corresponds to the length (refer to L of FIG. 1A) in the longer direction of the active region AR.

Figure 1E:
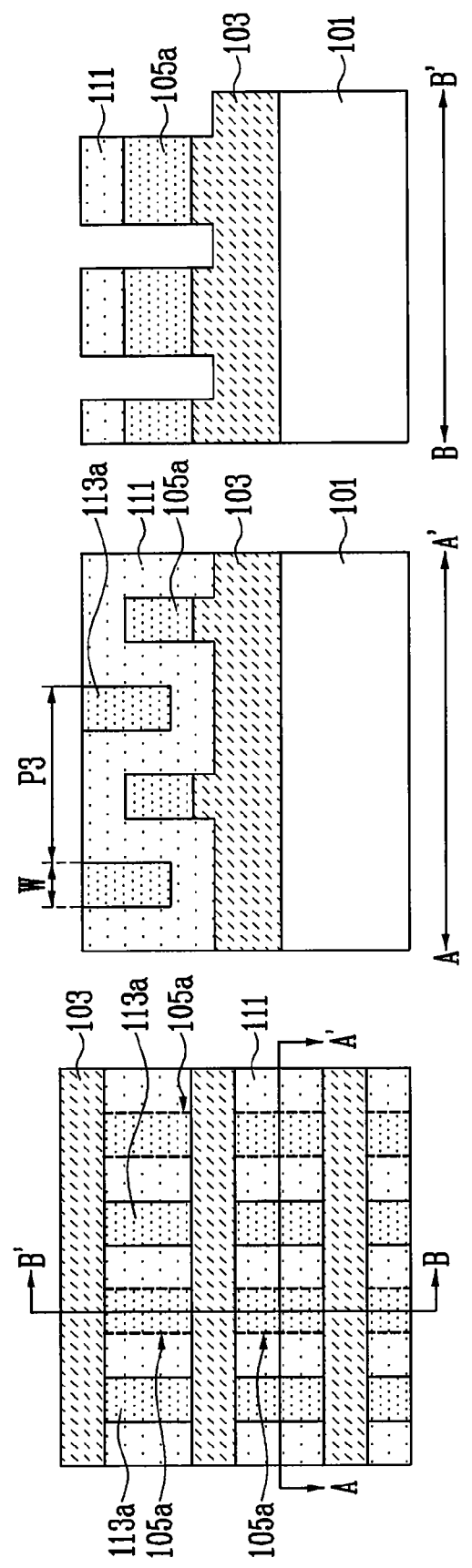

Referring to FIG. 1E, the second ARC layer 115 and the second etch mask film 113 are etched using an etch process employing the second photoresist patterns 117 as an etch mask. The auxiliary film 111 exposed by the second photoresist patterns 117 is etched. When etching the auxiliary film 111, the etch process can be controlled in such a manner that the etch characteristic of the second photoresist patterns 117 is substantially identical to that of the second ARC layer 115, so the second photoresist patterns 117 and the second ARC layer 115 can be removed together using the same etch process. If the second photoresist patterns 117 and the second ARC layer 115 remain, an additional etch process can be performed in order to remove the second photoresist patterns 117 and the second ARC layer 115. The auxiliary film 111 is patterned along the row direction and define isolated patterns along the row direction.

Thereafter, the first etch mask patterns 105a exposed by the auxiliary film 111 are etched. The first etch mask patterns 105a are thereby isolated in a column direction. That is, isolated first etch mask patterns are formed. The second etch mask film 113 remains only in the concave portions 111a defined by the auxiliary films 111. The second etch mask film 113 remaining in the concave portions 111a define a plurality of second etch mask patterns 113a. Accordingly, the second etch mask patterns 113a are self-aligned between the first etch mask patterns 105a. In other words, the first etch mask patterns 105a remain only on the active regions of the odd-numbered (or even-numbered) columns and the second etch mask patterns 113a remain only on the active regions of the even-numbered (or odd-numbered) columns. That is, the first and second etch mask patterns 105a and 113a are in an alternating pattern along the row direction.

The second etch mask patterns 113a are formed in parallel between the first etch mask patterns 105a and have a pitch P3, which is double the pitch of the target patterns, like the first etch mask patterns 105a. A width W of the second etch mask pattern 113a corresponds to the width of the active region.

A distance between the first etch mask pattern 105a and the second etch mask pattern 113a is determined by the thickness of the auxiliary film 111 formed on the sidewalls of the first etch mask patterns 105a. In particular, if the thickness of the auxiliary film 111 formed on both sidewalls of the first etch mask patterns 105a is uniform, the second etch mask pattern 113a is self-aligned at the middle of two adjacent first etch mask patterns 105a. As the second etch mask patterns 113a are formed, the auxiliary film 111 formed on the sidewalls and top surface of the first etch mask patterns 105a is exposed.

Figure 1F:
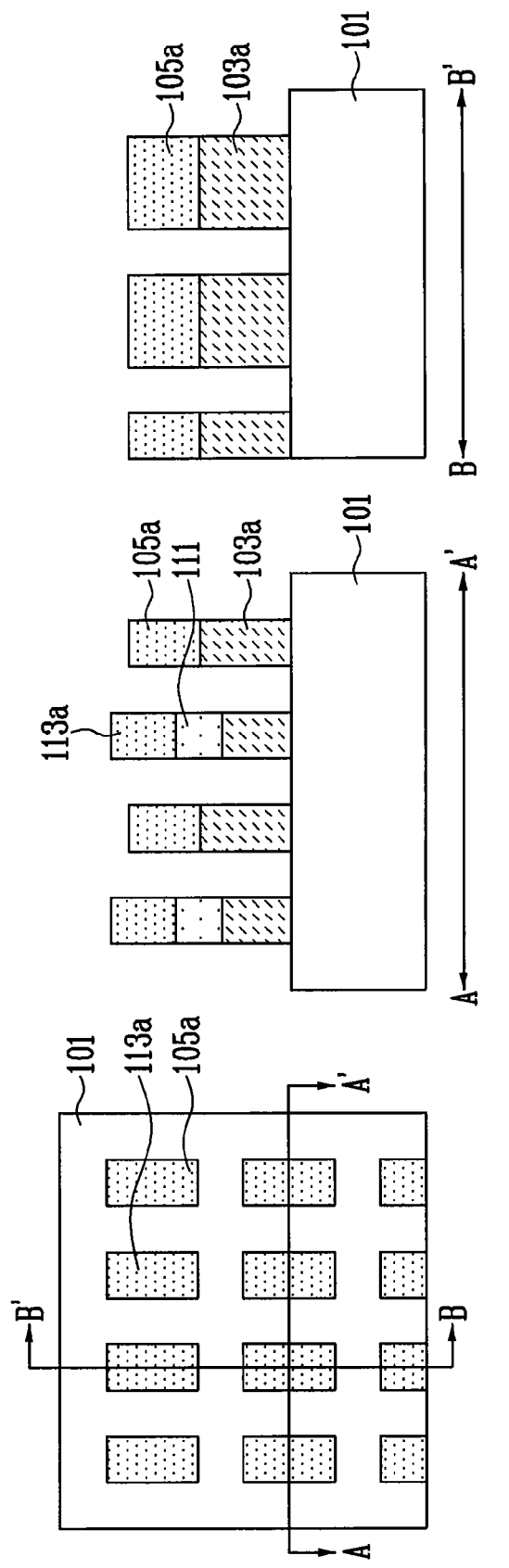

Referring to FIG. 1F, the auxiliary film 111 is removed using the first and second etch mask patterns 105a and 113a as etch masks. The auxiliary film 111 is removed using an etch process employing $O_2$ plasma in the present embodiment. Here, the auxiliary film 111 on the first etch mask patterns 105a is also removed. As the auxiliary film 111 is removed, the hard mask film 103 between the first and second etch mask patterns 105a and 113a is exposed. The exposed portions of the hard mask film 103 are removed, thus forming hard mask patterns 103a. The hard mask patterns 103a remain only on the active regions AR. Thereafter, though not shown in the drawings, the semiconductor substrate 101 can be etched using an etch process employing the hard mask patterns 103a in order to form trenches in the isolation regions.

In the above, it has been described that after the hard mask patterns 103a are formed by patterning the hard mask film 103 using the etch process employing the first and second etch mask patterns 105a and 113a, the semiconductor substrate 101 is etched using the etch process employing the hard mask patterns 103a. However, the semiconductor substrate 101 can be directly etched using an etch process employing the first and second etch mask patterns 105a and 113a without using the hard mask film 103. In this case, the formation process and etch process of the hard mask film 103 may be omitted.

As described above, the present invention has one or more of the following advantages.

First, at the time of the exposure process performed to form the first etch mask patterns, the photoresist patterns having a pitch, which is double the pitch of the target patterns, are formed. Thus, micro patterns can be formed with a pitch that is smaller than the resolution of an exposure apparatus.

Second, the second etch mask patterns are formed between the first etch mask patterns in a self-aligned manner. It is therefore possible to prevent the occurrence of misalignment.

Third, a distance between the first and second etch mask patterns can be controlled to a thickness of the auxiliary film formed on the sidewalls of the first etch mask patterns. Thus, the distance between the first and second etch mask patterns can be controlled more accurately.

Fourth, if the first etch mask patterns, the auxiliary film and the second etch mask patterns are formed of a transparent film such as the Si-containing BARC film or the carbon polymer film as described above, a key open process for exposing an alignment key, such as an overlay vernier, in a subsequent exposure process can be omitted.

Fifth, if the etch process of the Si-containing BARC film and the deposition process of the carbon polymer film are maintained in a vacuum state within the same apparatus, the above processes can be carried out in-situ consecutively. Accordingly, a process condition can be maintained stably and the turnaround time can be shortened.

Sixth, if the Si-containing BARC film is formed using the spin-coating method as described above, a burial characteristic can be improved. Thus, the Si-containing BARC film can be formed easily even in a space between micro patterns with a high aspect ratio without voids.

Seventh, in the prior art, in order to define active regions arranged in matrix form, an exposure process was performed using a first mask for defining the active regions located in an odd-numbered row and an odd-numbered column and a second mask for defining the active regions located in an even-numbered row and an even-numbered column. Thus, a problem can arise in misalignment due to the use of the two masks. However, in the present invention, a patterning process is performed once in a horizontal direction and a vertical direction, respectively. Although misalignment is generated, the width and distance of the active regions (target patterns) can be controlled accurately. That is, pattern failure due to misalignment can be prevented.

Eighth, if it is sought to implement a contact array using DEET (Double Expose & Etch Tech) in DRAM, two sheets of masks have to be separated in a check board form. If it is sought to define the check board type contact array using an exposure apparatus, a two-dimensional symmetrical illumination has to be used, which results in low resolutions. Due to this, k1 that can be implemented by DEET becomes 0.20 or higher. However, in the present invention, since a line form is defined using an exposure apparatus, k1 of up to 0.14 can be implemented using a strong illumination such as a dipole.

The present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

What is claimed is:

1. A method for forming micro patterns of a semiconductor device, the method comprising:
    forming first etch mask patterns extending along a first direction over a substrate, the first etch mask patterns having a first pitch that is larger than a second pitch of target patterns;
    forming an auxiliary film over the first etch mask patterns, the auxiliary film being conformal to the first etch mask patterns and defining a plurality of first trenches;
    forming an etch mask film over the auxiliary film, the etch mask film filling the first trenches;
    performing an etch process for etching the etch mask film, the auxiliary film, and the first etch mask patterns, the etched first etch mask patterns defining a plurality of isolated first etch mask patterns, each of the isolated first etch mask patterns being isolated from adjacent isolated first etch mask patterns along the first direction, the etch mask film remaining within the first trenches between the isolated first etch mask patterns as second etch mask patterns; and
    removing the auxiliary film exposed by the isolated first etch mask patterns and the second etch mask patterns.

2. The method of claim 1, wherein a thickness of the auxiliary film formed on sidewalls of the first etch mask patterns is used to define a distance between the first and second etch mask patterns.

3. The method of claim 1, wherein a thickness of the auxiliary film formed on sidewalls of the first etch mask patterns defines a horizontal distance of an active region.

4. The method of claim 1, wherein a width of at least one of the first etch mask patterns defines a width in a shorter direction of an active region.

5. The method of claim 1, wherein a distance between adjacent isolated first etch mask patterns corresponds to a vertical distance between adjacent active regions.

6. The method of claim 1, wherein a length of at least one of the isolated first etch mask patterns corresponds to a length in a longer direction of an active region.

7. The method of claim 1, wherein a length of at least one of the isolated first etch mask patterns is about twice as large as a width of the isolated first etch mask pattern.

8. The method of claim 1, wherein the first and second etch mask patterns comprises substantially the same material.

9. The method of claim 1, wherein the first etch mask patterns comprise a Si-containing Bottom Anti-Reflective Coating (BARC) film.

10. The method of claim 1, wherein the second etch mask patterns comprise a Si-containing BARC layer.

11. The method of claim 1, wherein the auxiliary film comprises a carbon polymer film.

12. The method of claim 1, wherein the auxiliary film is removed using an etch process employing $O_2$ plasma.

13. A method for forming micro patterns of a semiconductor device, the method comprising:
    forming first etch mask patterns over a semiconductor substrate;
    forming an auxiliary film over the first etch mask patterns, the auxiliary film defining a plurality of first trenches extending along a first direction, each first trench being defined between the adjacent first etch mask patterns;
    forming an etch mask film over the auxiliary film, the etch mask film filling the first trenches;
    etching the etch mask film, the auxiliary film, and the first etch mask patterns to form isolated first etch mask patterns and to form second etch mask patterns, each of the isolated first etch mask patterns being isolated from adjacent isolated first etch mask patterns along the first direction, the second etch mask patterns being formed by the etch mask film remaining in the first trenches between the isolated first etch mask patterns; and
    removing the auxiliary film exposed between the isolated first etch mask patterns and the second etch mask patterns.

14. The method of claim 13, wherein a pitch of the first etch mask patterns and a pitch of the second etch mask patterns is about twice as large as a pitch of target patterns.

15. The method of claim 13, wherein a thickness of the auxiliary film formed on sidewalls of the first etch mask patterns is used to define a distance between the first and second etch mask patterns.

16. The method of claim 13, wherein a thickness of the auxiliary film formed on sidewalls of the first etch mask patterns corresponds to a horizontal distance of an active region.

17. The method of claim 13, wherein a width of at least one of the first etch mask patterns corresponds to a width in a shorter direction of an active region.

18. The method of claim 13, wherein a distance between adjacent first etch mask patterns corresponds to a vertical distance between adjacent active regions.

19. The method of claim 13, wherein the first etch mask patterns that have been etched define the isolated first etch mask patterns, a length of at least one of the isolated first etch mask patterns corresponding to a length in a longer direction of an active region.

20. The method of claim 13, wherein the first etch mask patterns that have been etched define the isolated first etch mask patterns, a length of at least one of the isolated first etch mask patterns being about twice as large as a width of the isolated first etch mask pattern.

21. The method of claim 13, wherein the first and second etch mask patterns comprise substantially the same material.

22. The method of claim 13, wherein the first etch mask patterns comprise a Si-containing Bottom Anti-Reflective Coating (BARC) film.

23. The method of claim 13, wherein the second etch mask patterns comprise a Si-containing BARC layer.

24. The method of claim 13, wherein the auxiliary film comprises a carbon polymer film.

25. The method of claim 13, wherein the auxiliary film is removed using an etch process employing $O_2$ plasma.

26. A method for forming micro patterns of a semiconductor device, the method comprising:
   forming first etch mask patterns over a semiconductor substrate along a column direction;
   forming an auxiliary film over the first etch mask patterns, the auxiliary film defining a first trench between two adjacent first etch mask patterns, the first trench extending along the column direction;
   forming an etch mask film over the auxiliary film, the etch mask film filling the first trench;
   forming isolated first etch mask patterns and forming second etch mask patterns between the isolated first mask patterns by etching the etch mask film, the auxiliary film, and the first etch mask patterns, each of the isolated first etch mask patterns being isolated from adjacent isolated first etch mask patterns along the column direction; and
   removing the auxiliary film exposed between the isolated first etch mask patterns and the second etch mask patterns.

27. The method of claim 26, wherein a pitch of the first etch mask patterns is about twice as large as a pitch of target patterns.

28. The method of claim 26, wherein a distance between the first and second etch mask patterns is defined using a thickness of the auxiliary film formed on sidewalls of the first etch mask patterns.

29. The method of claim 26, wherein a thickness of the auxiliary film formed on sidewalls of the first etch mask patterns corresponds to a horizontal distance of an active region.

30. The method of claim 26, wherein a width of at least one of the first etch mask patterns corresponds to a width in a shorter direction of an active region.

31. The method of claim 26, wherein a distance defined between adjacent isolated first etch mask patterns corresponds to a vertical distance between adjacent active regions.

32. The method of claim 26, wherein the first etch mask patterns that have been etched define the isolated first etch mask patterns, a length of at least one of the isolated first etch mask patterns corresponding to a length in a longer direction of an active region.

33. The method of claim 26, wherein the first etch mask patterns that have been etched define the isolated first etch mask patterns, a length of at least one of the isolated first etch mask patterns being about twice as large as a width of the isolated first etch mask pattern.

34. The method of claim 26, wherein each of the second etch mask patterns are provided at about halfway between the two adjacent first etch mask patterns.

35. The method of claim 26, wherein the first and second etch mask patterns comprise substantially the same material.

36. The method of claim 26, wherein the first etch mask patterns comprise a Si-containing Bottom Anti-Reflective Coating (BARC) film.

37. The method of claim 26, wherein the second etch mask patterns comprise a Si-containing BARC layer.

38. The method of claim 26, wherein the auxiliary film comprises a carbon polymer film.

39. The method of claim 26, wherein the auxiliary film is removed using an etch process employing $O_2$ plasma.

40. A method for forming micro patterns of a semiconductor device, the method comprising:
   forming a hard mask film and a first etch mask film over a semiconductor substrate;
   etching the first etch mask film to form first etch mask patterns extending along a column direction;
   forming an auxiliary film over the hard mask film and the first etch mask patterns, the auxiliary film defining a first trench extending along the column direction;
   forming a second etch mask film over the auxiliary film, the second etch mask film filing the first trench;
   performing an etch process for etching the etch mask film, the auxiliary film, and the first etch mask patterns in order to form isolated first etch mask patterns and form second etch mask patterns, each of the isolated first etch mask patterns being isolated from adjacent isolated first etch mask patterns along the column direction, the second etch mask patterns being formed by the etch mask film remaining within the first trench between the isolated first etch mask patterns;
   removing the auxiliary film exposed between the isolated first etch mask patterns and the second etch mask patterns; and
   forming hard mask patterns by etching the hard mask film using an etch process employing the isolated first etch mask patterns and the second etch mask patterns.

41. The method of claim 40, wherein a pitch of the first etch mask patterns is about twice as large as a pitch of target patterns, the pitch of the first etch mask patterns being substantially the same as a pitch of the second etch mask patterns.

42. The method of claim 40, wherein a distance between the first and second etch mask patterns is defined using a thickness of the auxiliary film formed on sidewalls of the first etch mask patterns.

43. The method of claim 40, wherein a thickness of the auxiliary film formed on sidewalls of the first etch mask patterns corresponds to a horizontal distance of an active region.

44. The method of claim 40, wherein a width of the second etch mask patterns corresponds to a width in a shorter direction of an active region.

45. The method of claim 40, wherein a distance between the isolated first etch mask patterns defines a vertical distance between adjacent active regions.

46. The method of claim 40, wherein a length of at least one of the isolated first etch mask patterns corresponds to a length in a longer direction of an active region.

47. The method of claim 40, wherein a length of at least one of the isolated first etch mask patterns is about twice as large as a width of the isolated first etch mask pattern.

48. The method of claim 40, wherein the formation of the first etch mask patterns comprises:
   forming a photoresist pattern over the first etch mask film;
   forming the first etch mask patterns by etching the first etch mask film using an etch process employing the photoresist pattern; and
   further etching the hard mask film so that the photoresist pattern is removed.

49. The method of claim 40, wherein the first and second etch mask patterns comprise substantially the same material.

50. The method of claim 40, wherein the first etch mask patterns comprise using a Si-containing Bottom Anti-Reflective Coating (BARC) film.

51. The method of claim 40, wherein the second etch mask patterns comprise a Si-containing BARC layer.

52. The method of claim 40, wherein the auxiliary film comprises a carbon polymer film.

53. The method of claim 40, wherein the auxiliary film is removed using an etch process employing $O_2$ plasma.

54. The method of claim 40, wherein the hard mask film comprises a carbon film.

\* \* \* \* \*